United States Patent
He et al.

(10) Patent No.: US 9,881,869 B2
(45) Date of Patent: Jan. 30, 2018

(54) MIDDLE OF THE LINE INTEGRATED EFUSE IN TRENCH EPI STRUCTURE

(71) Applicant: INTERNATIONAL BUSINESS MACHINES CORPORATION, Armonk, NY (US)

(72) Inventors: Hong He, Schenectady, NY (US); Juntao Li, Cohoes, NY (US); Junli Wang, Slingerlands, NY (US); Chih-Chao Yang, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/366,296

(22) Filed: Dec. 1, 2016

(65) Prior Publication Data

US 2017/0170116 A1    Jun. 15, 2017

Related U.S. Application Data

(63) Continuation of application No. 14/969,717, filed on Dec. 15, 2015, now Pat. No. 9,666,527.

(51) Int. Cl.
*H01L 23/52* (2006.01)
*H01L 23/525* (2006.01)
*H01L 21/768* (2006.01)
*H01L 23/532* (2006.01)

(52) U.S. Cl.
CPC .... *H01L 23/5256* (2013.01); *H01L 21/76802* (2013.01); *H01L 21/76897* (2013.01); *H01L 23/53209* (2013.01)

(58) Field of Classification Search
CPC .................. H01L 23/5256; H01L 23/53209
See application file for complete search history.

(56) References Cited

U.S. PATENT DOCUMENTS

| | | | |
|---|---|---|---|
| 4,227,168 A | 10/1980 | Knapp, Jr. |
| 4,228,417 A | 10/1980 | Belcher |
| 4,240,058 A | 12/1980 | Kozacka et al. |
| 4,245,208 A | 1/1981 | Belcher |
| 4,254,394 A | 3/1981 | Kozacka et al. |
| 4,272,752 A | 6/1981 | Jacobs, Jr. |
| 4,306,212 A | 12/1981 | Belcher |
| 6,754,135 B2 | 6/2004 | Pilo |
| 6,897,543 B1 | 5/2005 | Huang et al. |
| 6,998,865 B2 | 2/2006 | Bard et al. |
| 7,157,782 B1 | 1/2007 | Shih et al. |
| 7,272,067 B1 | 9/2007 | Huang et al. |
| 7,960,760 B2 | 6/2011 | Marshall |

(Continued)

OTHER PUBLICATIONS

List of IBM Patents or Patent Applications Treated as Related dated Dec. 1, 2016, 2 pages.

(Continued)

*Primary Examiner* — Matthew Reames
(74) *Attorney, Agent, or Firm* — Tutunjian & Bitetto, P.C.; Vazken Alexanian

(57) ABSTRACT

A fuse includes a semiconductor layer having a dielectric material formed thereon. An epitaxially grown material is formed in a trench within the dielectric material. The epitaxially grown material includes a peak region. A fuse metal is formed over the peak region and extends along sidewalls of the trench and over the dielectric material outside the trench. Contacts are formed outside the trench connecting to fuse metal over the dielectric material.

20 Claims, 7 Drawing Sheets

(56) References Cited

U.S. PATENT DOCUMENTS

| | | |
|---|---|---|
| 8,053,809 B2 | 11/2011 | Cheng et al. |
| 8,274,132 B2 | 9/2012 | Russ et al. |
| 8,334,572 B2 | 12/2012 | Chung et al. |
| 8,400,813 B2 | 3/2013 | Lee |
| 8,471,296 B2 | 6/2013 | Cheng et al. |
| 8,569,116 B2 | 10/2013 | Mann et al. |
| 8,648,438 B2 | 2/2014 | Cai et al. |
| 9,041,151 B2 | 5/2015 | Lavoie et al. |
| 2013/0148409 A1 | 6/2013 | Chung |

OTHER PUBLICATIONS

Kothandaraman, C. et al., "Electrically programmable fuse (eFUSE) using electromigration in silicides" IEEE Electron Device Letters (Sep. 2002) pp. 523-525, vol. 23, No. 9.

Rizzolo, R.F. et al., "IBM System z9 eFUSE applications and methodology" IBM Journal of Research and Development (Jan. 2007) pp. 65-75, vol. 51, Issue 1-2.

US 9,881,869 B2

MIDDLE OF THE LINE INTEGRATED EFUSE IN TRENCH EPI STRUCTURE

BACKGROUND

Technical Field

The present invention relates to semiconductor processing, and more particularly to electrical fuses (eFuses or efuses) integrated into middle of the line (MOL) structures.

Description of the Related Art

Electrical fuses (efuses) are employed in the semiconductor industry to implement array redundancy, field programmable arrays, analog component trimming circuits, chip identification circuits, etc. An electrical fuse typically includes an anode, a cathode, and a fuselink. The fuselink is a narrow strip of a conductive material such as a metal adjoining the anode and cathode, which may also be composed of a metal. During programming of the electrical fuse, a positive voltage bias is applied to the anode and a negative voltage bias is applied to the cathode.

As electrical current flows through the fuselink having a narrow cross-sectional area, the temperature of the fuselink is elevated. A high current density combined with the elevated temperature at the fuselink facilitates electromigration of the conductive material. The conductive material is electromigrated under these conditions from the portion of the electrical fuse structure, thereby increasing the resistance of the electrical fuse structure.

Increased local current density has been obtained by the modification of the layout of the fuse. For example, a two-dimensional "dog-bone" shape fuse element having a small cross-sectional area between large cathode and anode pads increases local current density, and has been adopted in the semiconductor industry as eFuse elements for better process control and higher programming efficiency. eFuses have been planar in their overall design, which takes up valuable real-estate on a chip.

SUMMARY

A fuse includes a semiconductor layer having a dielectric material formed thereon. An epitaxially grown material is formed in a trench within the dielectric material; the epitaxially grown material includes a peak region. A fuse metal is formed over the peak region and extends along sidewalls of the trench and over the dielectric material outside the trench. Contacts are formed outside the trench connecting to fuse metal over the dielectric material.

Another fuse includes a semiconductor layer having a dielectric material formed thereon and an epitaxially grown material formed in a trench within the dielectric material, the epitaxially grown material including a peak region. A fuse metal is formed over the peak region and extends along sidewalls of the trench and over the dielectric material outside the trench. A conformal dielectric layer is formed over the fuse metal. A dielectric layer is formed on the conformal dielectric layer and within the trench. Contacts are formed outside the trench through the dielectric layer and connect to the fuse metal through the conformal dielectric layer.

A method for concurrently forming transistors and fuses includes forming a dielectric material over a semiconductor layer in a transistor region and in a fuse region; forming trenches in the dielectric material down to the semiconductor layer in the transistor region and in the fuse region; epitaxially growing material in the trenches in the transistor region and in the fuse region, where epitaxially grown material forms peak regions in the trenches; in the fuse region, depositing a fuse metal over the peak regions, along sidewalls of the trenches and over the dielectric material outside the trench; forming a dielectric layer in the transistor region and in the fuse region; and forming self-aligned contacts in the transistor region and in the fuse region, the contacts in the fuse region landing on the fuse metal to form electrical connections to the fuse metal.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
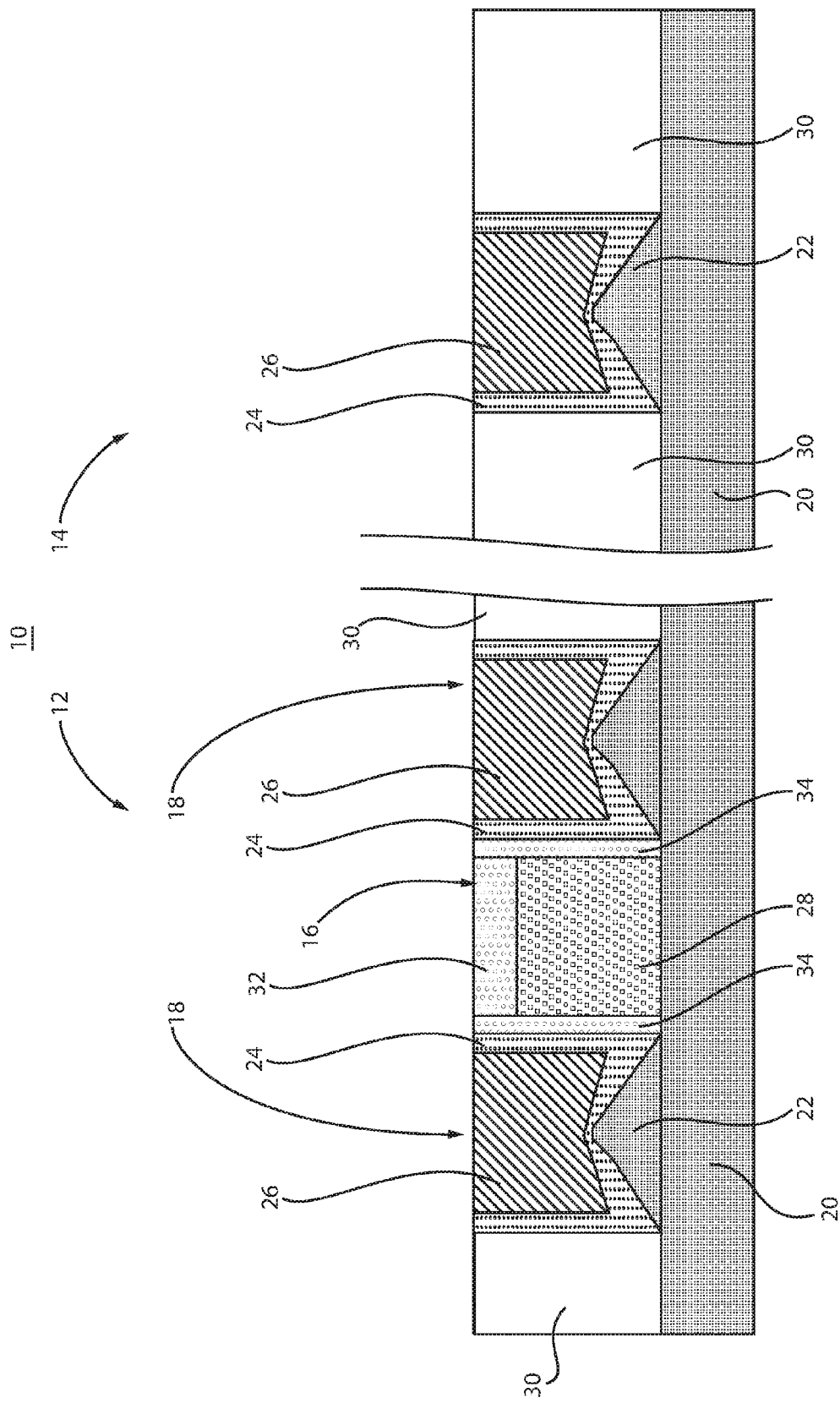
FIG. 1 is a cross-sectional view of a semiconductor device showing a transistor region with a gate structure and trench silicide contacts formed to connect to source and drain regions and showing a fuse region having trench silicide contacts formed concurrently with the trench silicide contacts in the transistor region in accordance with the present principles.

In accordance with the present principles, fuse structures and methods for their formation are provided that utilize feature topography and in particular epitaxially grown trench structures to create varying thicknesses for breakable efuse structures. The present efuse structures may be integrated into middle of the line (MOL) to far end of the line (FEOL) workflows.

In one embodiment, the efuses are formed in trenches on top of epitaxially grow structures. A topology of the epitaxially grown structures is employed to form the fuse structure and provides three-dimensional (3D) shaping of the fuse. A 3D shape assists in necking down a portion to increase current density in that portion. The fuse characteristics may be controlled based on its deposited thickness, which provides a high accuracy in programming efficiency.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., TiN, SiN or SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 10 is illustratively shown in accordance with one embodiment. The device 10 includes a transistor region 12 where transistor devices are formed. The transistors include regions 18 and a gate structure 16. The gate structure 16 includes a gate conductor 28, spacers 34 and a cap 32. The gate conductor 28 may include a metal or metal alloy, such as, e.g., W, TaN, TiN, TiC, Ti, Al, etc. The cap 32 and the spacers 34 may include a nitride, although other suitable dielectric materials may be employed. A thin gate dielectric is formed between the semiconductor layer 20 and the gate conductor 28.

The regions 18 are formed on a substrate or semiconductor material 20 within a dielectric layer 30. The semiconductor material 20 may include a planar bulk substrate, a fin or a semiconductor layer from a semiconductor-on-insulator (SOI substrate). The semiconductor material 20 may include Si, SiGe, Ge, III-V materials or any other suitable material. The semiconductor material 20 may include a monocrystalline structure and forms a channel therein (below the gate structure 16). The dielectric layer 30 may include an oxide or other suitable dielectric material.

The semiconductor material 20 has epitaxially grown regions 22, which form trench silicide (TS) regions with a metal layer 24 formed thereon. The TS regions which include a portion of the epitaxially grown regions 22 and a portion of the metal layer 24 may form source and drain regions (S/D regions) or be a part of S/D regions for the transistor device. The metal layer 24 includes metal but may additionally include non-metals along with a metal (e.g., TiN). In one embodiment, the metal layer 24 includes Ti, Pt, Ni, etc. depending on the type of transistor and the design. TS contacts 26 are formed on the metal layer 24. The TS contacts 26 may include W although other conductive materials may be employed.

To this point, a fuse region 14 includes the same structure as the transistor region 12 without gate structures 16. The fuse region 14 includes region 18 formed in the dielectric layer 30. The fuse region 14 includes the epitaxial region 22 and metal layer 24 formed thereon. TS contacts 26 may be formed in the fuse region 14.

Figure 2:
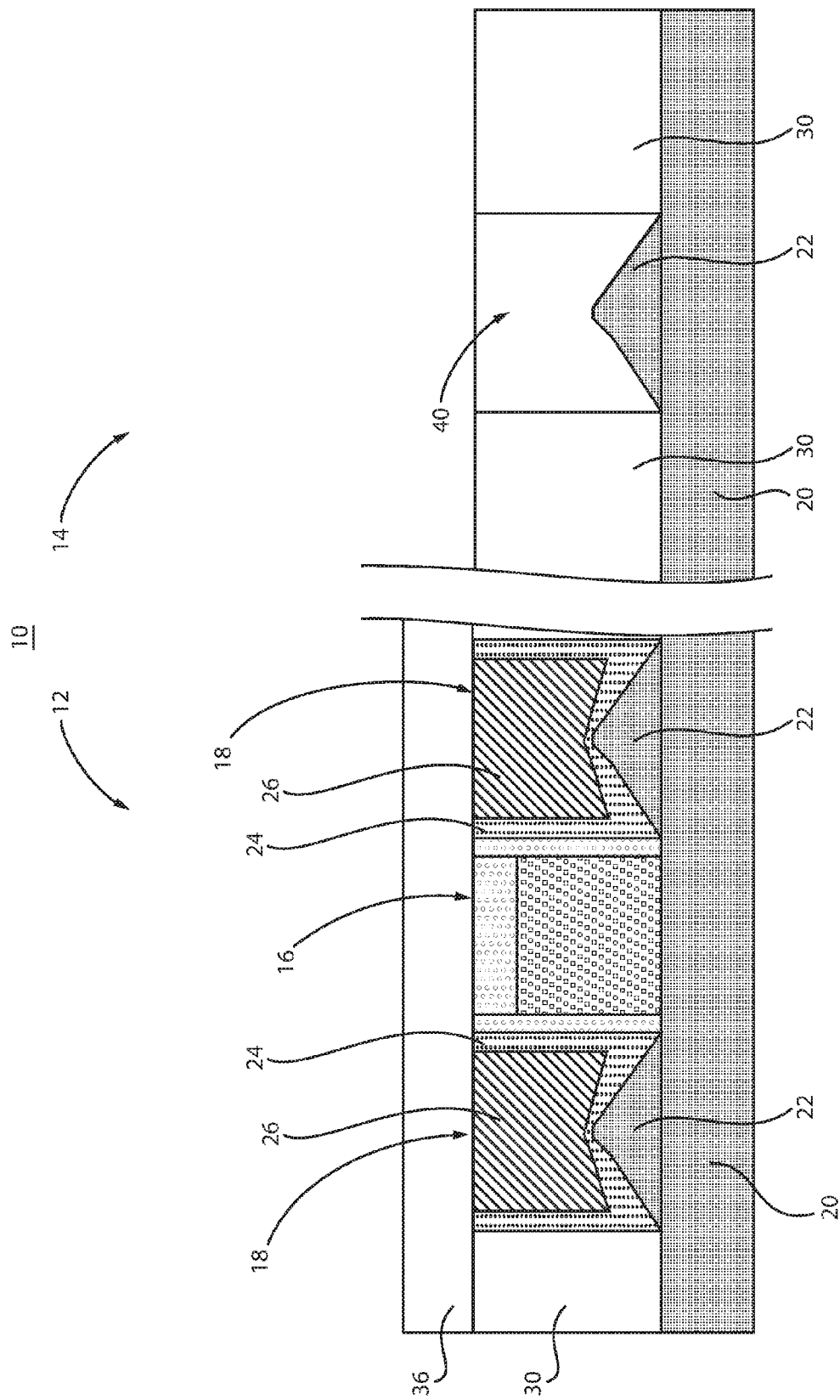
FIG. 2 is a cross-sectional view of the semiconductor device of FIG. 1 showing the transistor region covered and the trench silicide contacts removed from an epitaxially grown region in the fuse region in accordance with the present principles.

Referring to FIG. 2, a dielectric layer 36 is formed over the device and patterned/etched to remove the dielectric layer 36 from the fuse region 14 and maintain the dielectric layer 36 over the transistor region 12. The dielectric layer 36 may include a same material as dielectric layer 30. In one embodiment, the dielectric layer 36 includes an oxide, such as silicon oxide. The dielectric layer 36 protects the transistor region 12 from etching processes conducted to remove the TS contact 26 and the metal layer 24 from a trench 40 formed in the dielectric layer 30 of the fuse region 14.

The TS contact 26 and the metal layer 24 may be removed by a selective etch process, such as a wet etch or a dry etch. The TS contact 26 and the metal layer 24 can be removed to expose the underlying epitaxially grown region 22 in the fuse region 14.

Figure 3:
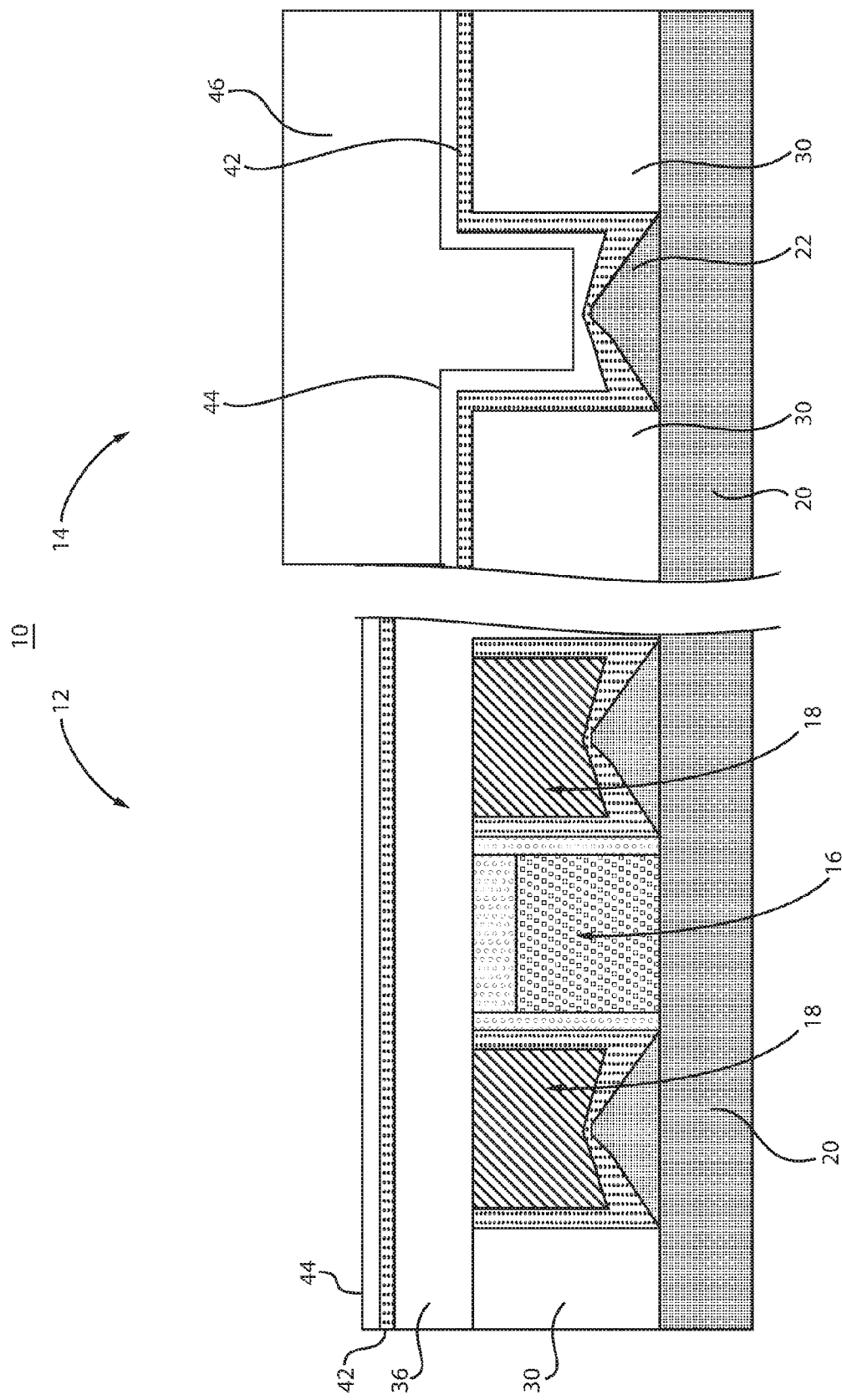
FIG. 3 is a cross-sectional view of the semiconductor device of FIG. 2 showing a fuse metal layer and a conformal dielectric layer formed and the fuse region blocked with a block mask in accordance with the present principles.

Referring to FIG. 3, a fuse metal layer 42 is conformally deposited over the device 10. The fuse metal layer 42 covers the epitaxially grown material 22 in the fuse region 14 and covers the dielectric layer 36 in the transistor region 12. The fuse metal layer 42 may include metal or metal containing materials. In one embodiment, the fuse metal layer 42 includes a silicide, Si, Ti, Al, Ta, Cu, Co, Ru and their alloy materials. The fuse metal 42 may include a deposit thickness at a field area of between about 5 angstroms to about 500 angstroms. In particularly useful embodiments, the fuse metal 42 includes a deposit thickness of between about 20 angstroms to about 100 angstroms.

A conformal dielectric layer 44 is conformally deposited over the device 10. The conformal dielectric layer 44 covers the fuse metal layer 42 in the fuse region 14 and in the transistor region 12. The conformal dielectric layer 44 may include a nitride, such as SiN, SiBCN or other suitable dielectric material.

A block mask 46 is formed on the device 10 and is patterned to cover the fuse region 14 and expose the transistor region 12. The block mask 46 may include a resist material or dielectric material. The block mask 46 includes a material configured to resist the processing of the unblocked regions. The block mask 46 protects the fuse region 14 during processing of the transistor region 12.

Figure 4:
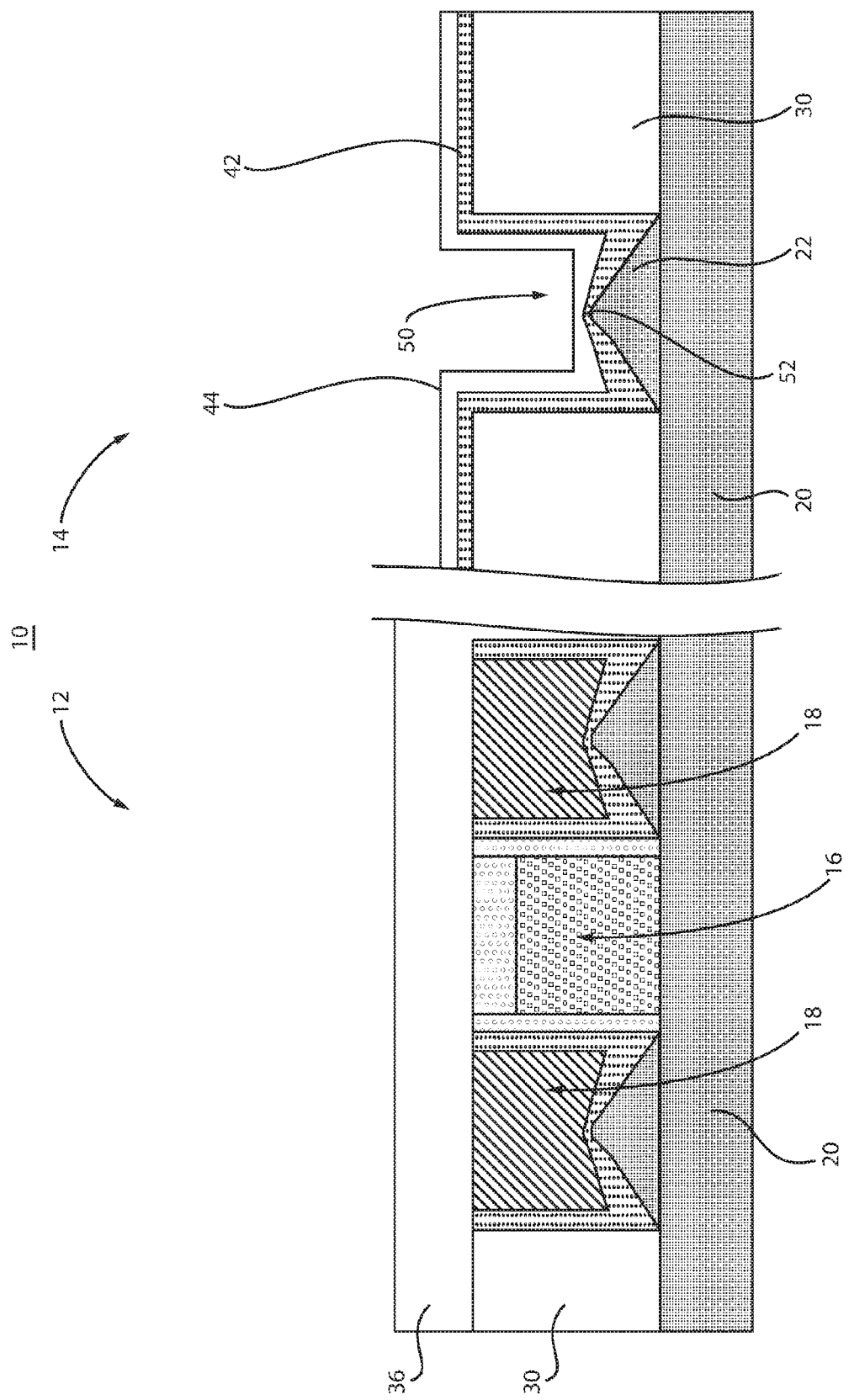
FIG. 4 is a cross-sectional view of the semiconductor device of FIG. 3 showing the fuse metal layer and the conformal dielectric layer removed from the transistor region and the block mask removed from the fuse region in accordance with the present principles.

Referring to FIG. 4, the conformal dielectric layer 44 and the fuse metal layer 42 are removed from the transistor region 12 by an etch process. The fuse region 14 is protected by the block mask 46 during the removal of the conformal dielectric layer 44 and the fuse metal layer 42 from the transistor region 12. Then, the block mask 46 is removed from the fuse region 14 to expose the conformal dielectric layer 44. This forms a basic structure of an efuse 50.

The efuse 50 takes advantage of the pyramidal or pointed shape of the epitaxially grown region 22. Using this shape, the efuse 50 may be fabricated by controlling a thickness of the fuse metal layer 42. The fuse metal layer 42 has a smaller thickness at a peak 52 to increase charge density at that point to cause the fuse metal layer 42 to electromigrate or blow by other mechanism at that the peak 52. This permits accurate control of the fuse blow conditions and permits the accurate fabrication of the fuse 50 based upon the control of the thickness of the fuse metal layer 42.

Figure 5:
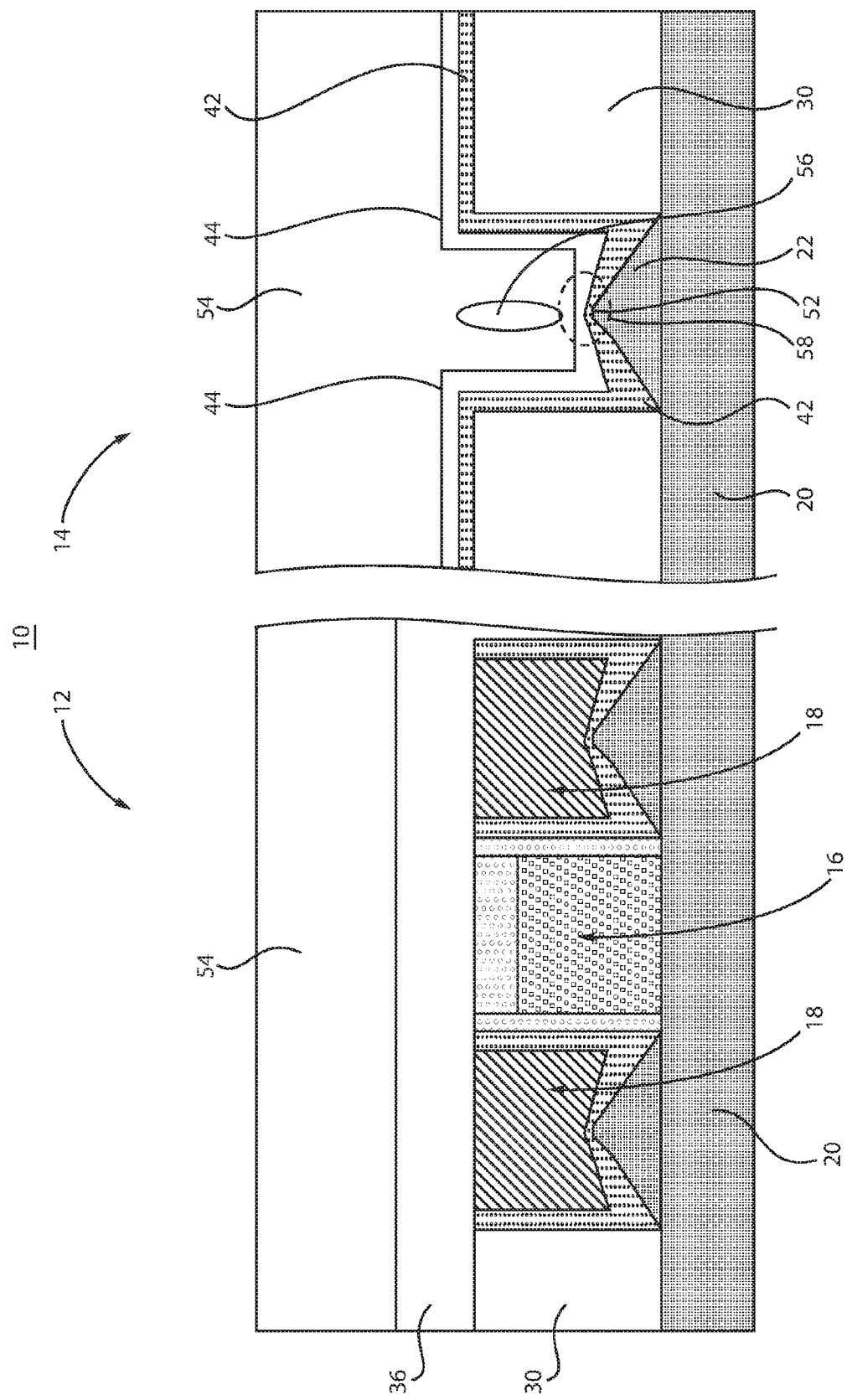
FIG. 5 is a cross-sectional view of the semiconductor device of FIG. 4 showing a dielectric layer formed on the transistor region and the fuse region and including an air gap in the trenches of the fuse region in accordance with the present principles.

Referring to FIG. 5, a dielectric layer 54 is deposited over the conformal dielectric layer 44 in the fuse region 14. The dielectric layer 54 may include an oxide and is preferably the same material as the underlying dielectric layer 36; however, layer 54 may include a different material than the dielectric layer 36. The dielectric layer 54 may include any suitable dielectric material. The dielectric layer 54 may be deposited to form an air gap 56 over the peak 52. The air gap 56 may be formed by depositing the dielectric layer 54 at a rate configured to cause pinch off in the fuse trench. The air gap 56 (along with conformal dielectric layer 44) provides high dielectric properties to reduce heat conduction and enhance/accelerate electromigration by increasing heat at the peak 52 and in the fuse area 58. The air gap 56 is optional. The fuse 50 properties are localized to the fuse area 58 and can be controlled with great precision in accordance with the present principles.

The dielectric layer 54 is formed over the transistor region 12 on the dielectric layer 36. The dielectric layer 54 may be planarized to form a planar top surface in both the transistor region 12 and the fuse region 14.

Figure 6:
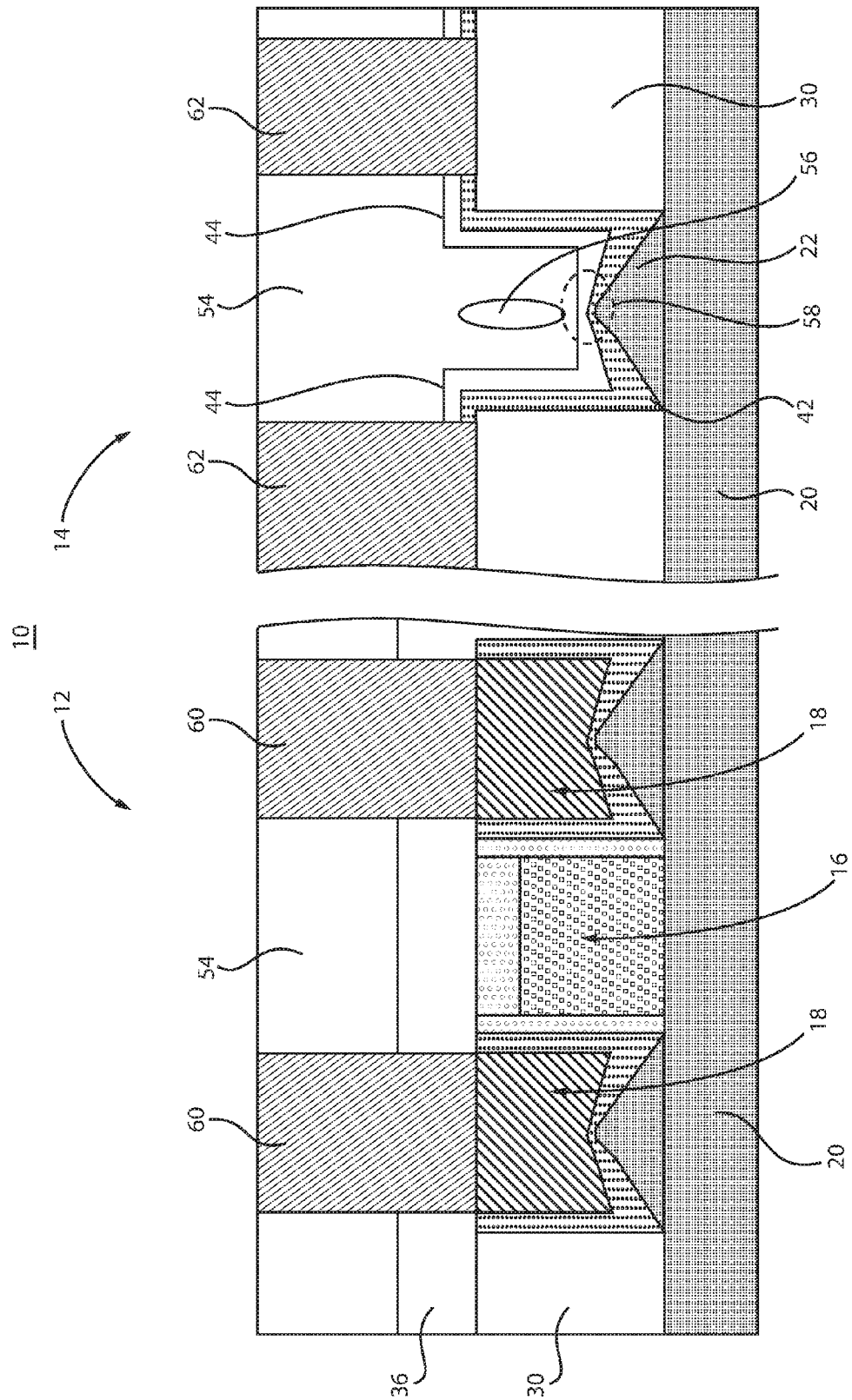
FIG. 6 is a cross-sectional view of the semiconductor device of FIG. 5 showing self-aligned contacts formed concurrently in the transistor region and the fuse region in accordance with the present principles.

Referring to FIG. 6, contact openings are made through the dielectric layers 54 and 36 in the transistor region 12 and concurrently through the dielectric layer 54 and conformal dielectric layer 44 in the fuse region 14. Contacts 60 and 62 are formed concurrently through the dielectric layers 54 and 36 in the transistor region 12 and through the dielectric layer 54 and conformal dielectric layer 44 in the fuse region 14. Contacts 60, 62 are formed by depositing a metal, such as, e.g., W, Al, etc. in the contact openings. Contacts 60 include self-aligned contacts (SAC) and land on the TS contacts 26. Contacts 62 are also self-aligned contacts (SAC) and land on portions of the fuse metal layer 42. After the deposition of the contact material, a planarization process is performed over the whole device 10 to remove the contact metal from a top surface of the dielectric layer 54.

Contacts 62 provide connections for applying a voltage and a ground to the effuse 50 when programming the fuse or to protect circuits on the device 10. One of the contacts 62 may be employed for applying a voltage to a predetermined magnitude and the other contact 62 is for applying a ground potential. Other combinations of potentials are also contemplated.

In particularly useful embodiments, programming voltages may be between about 0.2 to about 12 volts. A preferred programming voltage range may be between about 2 and about 6 volts.

Figure 7:
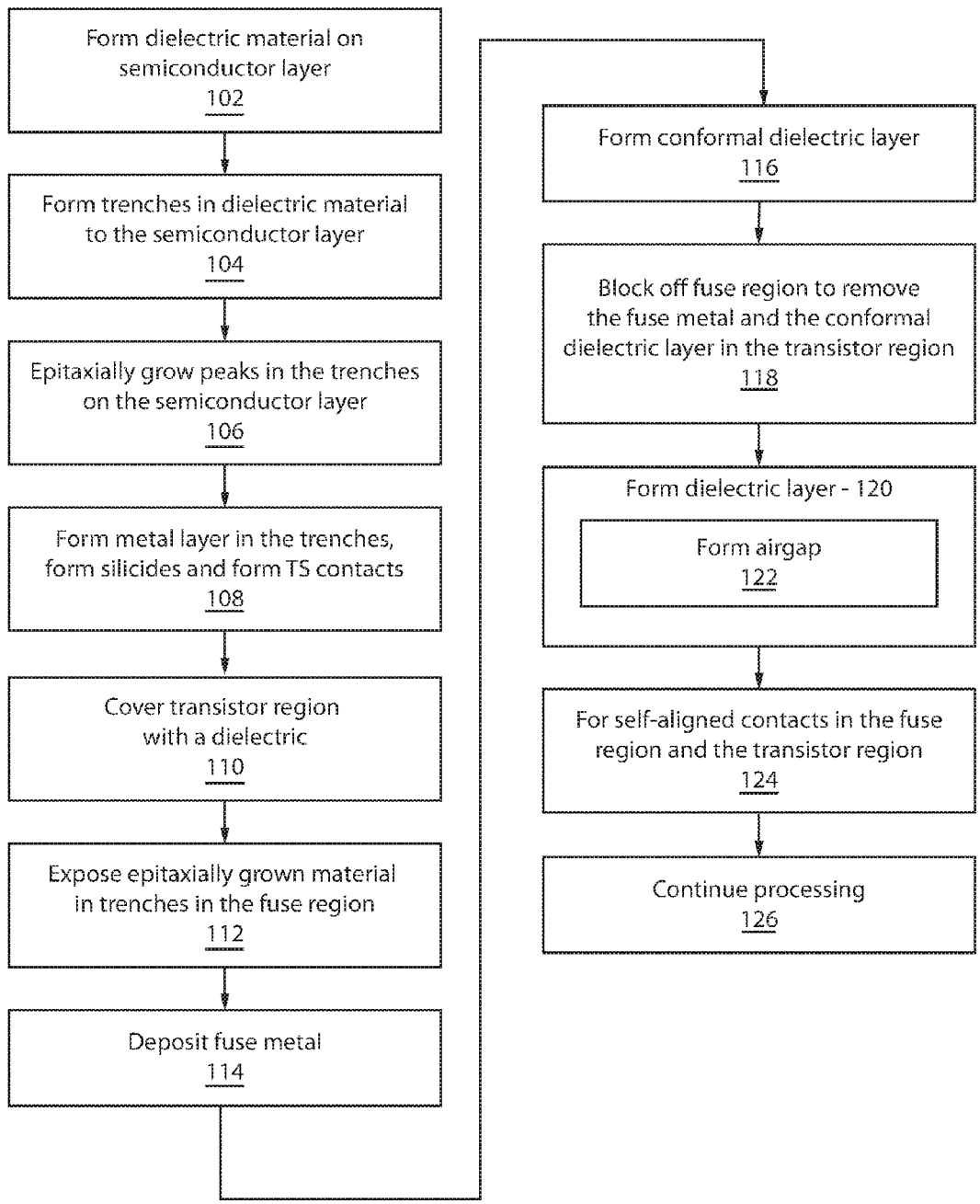
FIG. 7 is a block/flow diagram showing a method for concurrently forming transistors and fuses in accordance with illustrative embodiments.

Referring to FIG. 7, a method for concurrently forming transistors and fuses is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a dielectric material is formed over a semiconductor layer in a transistor region and in a fuse region. The semiconductor layer may include a planar material such as a bulk substrate or SOI substrate, over a fin, etc. In block 104, trenches are formed in the dielectric material down to the semiconductor layer in the transistor region and in the fuse region. In block 106, material is epitaxially grown in the trenches in the transistor region and in the fuse region. The epitaxially grown material forms peak regions in the trenches. The epitaxially grown material may include epitaxially growing material in a pyramidal or pitched shape to form the peak region. The trench is preferably elongated so the peak may be elongated as well (in the longitudinal direction where the peak may resemble a roof peak). The fuse to be formed may be made to any width (transverse to the trench longitudinal direction) and the dimensions may be controlled to provide the desired fuse operation.

In block 108, a metal layer for forming trench silicide is formed in the trenches followed by TS contacts and a CMP or other planarization process. In block 110, the transistor region is covered by a dielectric material. In block 112, the trenches in the fuse region are etched to expose the epitaxially grown material.

In block 114, in the fuse region, a fuse metal is deposited over the peak regions, along sidewalls of the trenches and over the dielectric material outside the trench. The fuse metal may be deposited with a thickness over the peak region configured to cause an open circuit by melting away (e.g., through electromigration or other mechanism) under an applied voltage condition to the contacts. The thickness of the fuse material is easily controlled so that accurate fuses can be formed.

In one useful embodiment, the fuse metal/material includes a thickness that varies as the peak region is approached such that the fuse metal is thinnest at the peak region. In one embodiment, the fuse material includes a silicide, Si, Ti, Al, Ta, Cu, Co, Ru and their alloy materials. The fuse material may include a deposit thickness at a field area of between about 5 angstroms to about 500 angstroms. In particularly useful embodiments, the fuse material includes a deposit thickness of between about 20 angstroms to about 100 angstroms.

In block 116, a conformal dielectric layer is formed over the fuse metal. In block 118, the fuse region is blocked off to permit the fuse metal and the conformal dielectric layer to be removed from the transistor region. The block mask is then removed. In block 120, a dielectric layer is formed in the transistor region and in the fuse region. In block 122, the dielectric layer may include forming an air gap over the peak region of fuse metal. The air gap may be formed by depositing the dielectric material such that the dielectric material is pinched off within the trench.

In block 124, self-aligned contacts are formed in the transistor region and in the fuse region. The contacts in the fuse region land on the fuse metal to form electrical connections to the fuse metal. In block 126, processing can continue with the formation of additional structures and layers in the transistor region and in the fuse region.

Having described preferred embodiments for a middle of the line integrated efuse in a trench epi structure (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A fuse, comprising:
a semiconductor layer having a dielectric material formed thereon;
an epitaxially grown material grown on an exposed portion of the semiconductor layer in a trench within the dielectric material, the epitaxially grown material including a peak region;
a fuse metal formed over the peak region and extending along sidewalls of the trench and over the dielectric material outside the trench; and
contacts formed outside the trench connecting to the fuse metal over the dielectric material.

2. The fuse as recited in claim 1, wherein the semiconductor layer includes one of a planar material or a fin.

3. The fuse as recited in claim 1, wherein the epitaxially grown material includes a pyramidal or pitched shape to form the peak region.

4. The fuse as recited in claim 1, wherein the fuse metal is deposited with a thickness over the peak region configured to cause an open circuit by melting away under an applied voltage condition to the contacts.

5. The fuse as recited in claim 1, further comprising a conformal dielectric layer foniied over the fuse metal.

6. The fuse as recited in claim 1, further comprising a second dielectric layer, wherein the contacts are formed through the second dielectric layer being formed over the fuse metal.

7. The fuse as recited in claim 6, wherein the second dielectric layer froms an air gap over the peak region of the fuse metal.

8. The fuse as recited in claim 1, wherein the fuse metal includes a metal silicide.

9. The fuse as recited in claim 1, wherein the fuse metal further comprises having a thickness that varies and being thinnest at the peak region and thickest at end portions of the peak region adjacent to the sidewalls of the trench.

10. A fuse, comprising:
a semiconductor layer having a dielectric material formed thereon;
an epitaxially grown material formed in a trench within the dielectric material, the epitaxially grown material including a peak region, wherein a height of the peak region is lower than an overall height of the trench;
a fuse metal formed over the peak region and extending along sidewalls of the trench and over the dielectric material outside the trench;
a conformal dielectric layer formed over the fuse metal;
a dielectric layer formed on the conformal dielectric layer and within the trench; and
contacts formed outside the trench through the dielectric layer and connecting to the fuse metal through the conformal dielectric layer.

11. The fuse as recited in claim 10, wherein the semiconductor layer includes one of a planar material or a fin.

12. The fuse as recited in claim 10, wherein the epitaxially grown material is grown on the semiconductor layer in the trench and includes a pyramidal or pitched shape to form the peak region.

13. The fuse as recited in claim 10, wherein the fuse metal is deposited with a thickness over the peak region configured to cause an open circuit by melting away under an applied voltage condition to the contacts.

14. The fuse as recited in claim 10, wherein the dielectric layer forms an air gap over the peak region of fuse metal.

15. The fuse as recited in claim 10, wherein the fuse metal includes a metal silicide.

16. The fuse as recited in claim 10, wherein the fuse metal further comprises having a thickness that varies and being thinnest at the peak region and thickest at end portions of the peak region adjacent to the sidewalls of the trench.

17. A method for concurrently forming transistors and fuses, comprising:
forming a dielectric material over a semiconductor layer in a transistor region and in a fuse region;

forming trenches in the dielectric material down to the semiconductor layer in the transistor region and in the fuse region;

epitaxially growing material in the trenches in the transistor region and in the fuse region, where epitaxially grown material forms peak regions in the trenches, wherein a height of each of the peak regions is lower than an overall height of the trenches;

in the fuse region, depositing a fuse metal over the peak regions, along sidewalls of the trenches and over the dielectric material outside the trench;

forming a dielectric layer in the transistor region and in the fuse region; and forming self-aligned contacts in the transistor region and in the fuse region, the contacts in the fuse region landing on the fuse metal to form electrical connections to the fuse metal.

18. The method as recited in claim 17, wherein epitaxially growing material incudes epitaxially growing material in a pyramidal or pitched shape to form the peak region.

19. The method as recited in claim 17, wherein depositing the fuse metal includes depositing the fuse metal with a thickness over the peak region configured to cause an open circuit by melting away under an applied voltage condition to the contacts.

20. The method as recited in claim 17, wherein forming the dielectric layer includes forming an air gap over the peak region of the fuse metal.

* * * * *